United States Patent
Trueby et al.

(10) Patent No.: US 6,281,557 B1
(45) Date of Patent: Aug. 28, 2001

(54) READ-ONLY MEMORY CELL ARRAY AND METHOD FOR FABRICATING IT

(75) Inventors: Alexander Trueby, Dresen; Ulrich Zimmermann, Dresden; Armin Kohlhase, Neubiberg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/126,173

(22) Filed: Jul. 30, 1998

(30) Foreign Application Priority Data

Jul. 30, 1997 (DE) ................................. 197 32 871

(51) Int. Cl.[7] .................................................. H01L 29/76
(52) U.S. Cl. .......................... 257/390; 257/300; 257/301; 257/302; 257/306; 257/329; 257/336; 257/391; 257/392; 257/397; 257/390; 257/501; 257/510; 257/513; 438/128; 438/129; 438/130; 438/275; 438/278; 438/290
(58) Field of Search ..................................... 257/390, 302, 257/336, 391, 392, 300, 306, 301, 397, 329, 501, 510, 513; 438/128, 129, 130, 275, 278, 290

(56) References Cited

U.S. PATENT DOCUMENTS

| | | | |
|---|---|---|---|
| 4,990,980 | * 2/1991 | Wada | 257/302 |
| 5,786,263 | * 7/1998 | Perera | 438/431 |
| 5,793,086 | * 8/1998 | Ghio et al. | 257/336 |
| 5,821,591 | * 10/1998 | Krautschneider et al. | 257/390 |
| 5,973,373 | * 10/1999 | Krautschneider et al. | 257/390 |
| 5,976,947 | * 11/1999 | Reinberg | 438/424 |

FOREIGN PATENT DOCUMENTS 63-46760   2/1988 (JP).

* cited by examiner

Primary Examiner—Eddie Lee
Assistant Examiner—Matthew E. Warren
(74) Attorney, Agent, or Firm—Herbert L. Lerner; Laurence A. Greenberg; Werner H. Stemer

(57) ABSTRACT

A read-only memory cell array has vertical MOS transistors formed on trench walls, and is programmed with a programming mask which covers only the areas at which a transistor is not to be produced. As a result, the word lines can be formed with minimum grid spacing and the risk of short-circuiting between adjacent word lines is eliminated by buried ploy stringers.

5 Claims, 2 Drawing Sheets

READ-ONLY MEMORY CELL ARRAY AND METHOD FOR FABRICATING IT

BACKGROUND OF THE INVENTION

Field of the Invention

The invention relates to a read-only memory cell array and a method for producing the memory cell. In semiconductor technology, read-only memories (ROM) can be implemented by a memory cell array in which the individual memory cells essentially include vertical MOS transistors in a semiconductor substrate. When the memory cell configuration is read out, the individual memory cells are selected via a word line. The gate electrode of the MOS transistors is in each case connected to the word line. The input of each MOS transistor is connected to a reference line, and the output to a bit line. During the reading procedure, it is assessed whether or not a current is flowing through the transistor. The logic values zero and one are assigned as a function of this. Technically, the zero and one values are stored in the read-only memory by virtue of the fact that, in memory cells in which the logic value assigned results in "no current flow through the transistor", neither a MOS transistor nor a connective connection to the bit line is produced. Alternatively, the two logic values can be implemented by MOS transistors which have different threshold voltages owing to different implantations in the channel area. Such memory cells are described in detail in German Patents DE 195 14 834 C1 and DE 44 37 581 C2, for example.

In the known fabricating methods, vertically disposed doped areas to be produced in the semiconductor substrate are used to form the vertical MOS transistors. Long trenches which extend in parallel are etched into the semiconductor substrate and are filled with an insulation material. Strip-shaped, doped regions which are oppositely doped to the semiconductor substrate form a bit line used to read out the memory cell or as a reference line which can be disposed on the base and/or on the substrate surface.

At points at which the MOS transistor is to be formed (the corresponding cells are referred to below, as in the quoted patent documents, as "first memory cells"), a suitable etching mask (so-called programming mask) is used to etch a hole into the first insulation material in the trench. The hole exposes the trench wall assigned to the first memory cell. At the other points, that is to say in the region of second memory cells which do not have a MOS transistor, and in the region between two memory cells which are adjacent in the direction of the trench, no hole is etched. In other words, the trench remains filled with the first insulation material. Then, a gate oxide is produced in the hole, and polysilicon, for example, is deposited and structured to form word lines, where the word lines run transversely with respect to the trenches. The word line here covers the gate oxide on the trench wall and thus forms the gate of the first memory cell. More details on the fabrication methods are described in the above-mentioned patent documents.

In the conventional fabrication methods, the following problems arise:

First, when the trench is filled with the insulating material, so-called shrinkage cavities may arise. These are porous weak points or holes which are produced approximately in the center of the trench as a growth joint if the deposited layer thickness is precisely half the width of the trench. As the trench fills up, the shrinkage cavities are buried. If the hole is subsequently etched using the programming mask to produce the transistor, the shrinkage cavity is opened at the sides, and, during the later deposition of the word-line material, the shrinkage cavity is filled with this conductive material, that is to say for example polysilicon to form the word lines. The buried polysilicon stringer cannot be removed during the structuring of the polysilicon into word lines. As a result, a short-circuit is produced between adjacent word lines, that is to say in particular between adjacent first memory cells.

Second, in order to ensure a reliable overlap of a word line and a programming hole in the event of alignment errors of the word line mask with respect to the programming mask, it is necessary in the conventional methods to select the width of the word lines to be greater than the width of the holes. As a rule of thumb, an alignment error of ⅓ F is to be calculated for a structure size F which has the minimum possible resolution, so that the width of the word lines must be ⅝ F. Since the word-line spacing must be at least F, the word line grid spacing is increased to 2⅔ F.

SUMMARY OF THE INVENTION:

It is accordingly an object of the invention to provide a read-only memory cell array and method for fabricating it which overcome the above-mentioned disadvantages of the prior art devices and methods of this general type.

With the foregoing and other objects in view there is provided, in accordance with the invention, a read-only memory cell array, including: a semiconductor substrate; a cell matrix formed in the semiconductor substrate, the cell matrix has a plurality of strip-shaped trenches running essentially parallel with each other, the trenches have trench walls, the cell matrix includes first memory cells each having MOS transistors disposed vertically with respect to the semiconductor substrate, and second memory cells without any vertical MOS transistors, the first and second memory cells are disposed on predetermined sections of the trench walls; a gate dielectric and a gate electrode covering the trench walls in a region of the first memory cells, the MOS transistor disposed on the trench walls; a first insulation material covering the trench walls in a region of the second memory cells; a second insulation material and the gate dielectric disposed in the trenches between one of the first memory cells and one of another adjacent one of the first memory cells and one of the second memory cells adjacent in a direction of the trenches; and word lines running transversely with respect to the trenches and connected to the gate electrode respectively lying under the word lines.

In accordance with an added feature of the invention, the first insulation material includes TEOS, and the second insulation material includes one of TEOS and BPSG.

In accordance with another feature of the invention, the word lines have a width and the width is equal to a spacing between the word lines.

With the foregoing and other objects in view there is also provided, in accordance with the invention, a read-only memory cell array has a cell matrix formed in a semiconductor substrate, the cell matrix includes first memory cells with vertical MOS transistors protruding upward from the semiconductor substrate along trenches, and second memory cells without any vertical MOS transistors, in combination with a mask for programming the read-only memory cell, including: a mask body covering areas of the second memory cells in the cell matrix, and leaving open areas between two adjacent first memory cells in a direction of the trenches.

With the foregoing and other objects in view there is further provided, in accordance with the invention, in a method for fabricating a read-only memory cell array having a cell matrix disposed in a semiconductor substrate, the cell matrix having first memory cells with MOS transistors and second memory cells without any MOS transistors, the improvement which includes: producing a plurality of strip-shaped trenches running essentially parallel to each other in the semiconductor substrate and forming the trenches with trench walls; forming MOS transistors essentially vertical with respect to the semiconductor substrate at predetermined points on the trench walls; filling the trenches with a first insulation material; removing the first insulation material in the cell matrix from the trenches at all points with the aid of a programming mask covering areas designated for second memory cells; depositing a gate dielectric and a conductive layer in the exposed trench walls for completing the MOS transistors; structuring the conductive layer to form strip-shaped word lines which run transversely with respect to the trenches; and filling non-filled trench sections remaining between the word lines with a second insulation material.

The invention is based on using a programming mask which covers only the areas of the second memory cells, that is to say defines only the points at which the insulation material is not to be etched. Therefore, the insulation material is etched out at continuous points and the remaining insulation material forms islands whereas, in the known method, only non-continuous holes are etched and the remaining insulation material is continuous.

Then, as is customary, a gate dielectric is produced at the points which have been exposed by the etching and a conductive layer is deposited and structured to form strip-shaped word lines which run transversely with respect to the trenches. When structuring the word lines it must be ensured that there are no residues of the layers remaining in the trench between the word lines so that adjacent word lines are insulated from one another. The remaining non-filled trench sections, that is to say, for example, between two first memory cells which are adjacent in the direction of the trench, are then filled with a second insulation material.

The process described thus avoids the problem of shrinkage cavities, since the first insulation material, and thus the shrinkage cavity between two first memory cells located in the same trench are always removed during the programming etching. In addition, a reliable overlap of the word lines over the programming "hole" (that is to say points with an absence of insulation material in the trench) is provided. The word line must therefore not be wider than the minimum structure size F. In other words, the word-line grid spacing can correspond to the minimum grid spacing 2 F, even allowing for alignment errors.

The invention can advantageously be applied to the read-only memory cell arrays and fabrication methods described in the German Patent documents DE 195 14 834 C1 or DE 44 37 581 C2 specified above. Only the programming mask has to be changed, and a second insulation material has to be applied after the word-line structuring. The German Patents DE 195 14 834 C1 or DE 44 37 581 C2 are hereby incorporated by reference in their entirety.

Other features which are considered as characteristic for the invention are set forth in the appended claims.

Although the invention is illustrated and described herein as embodied in a read-only memory cell array and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
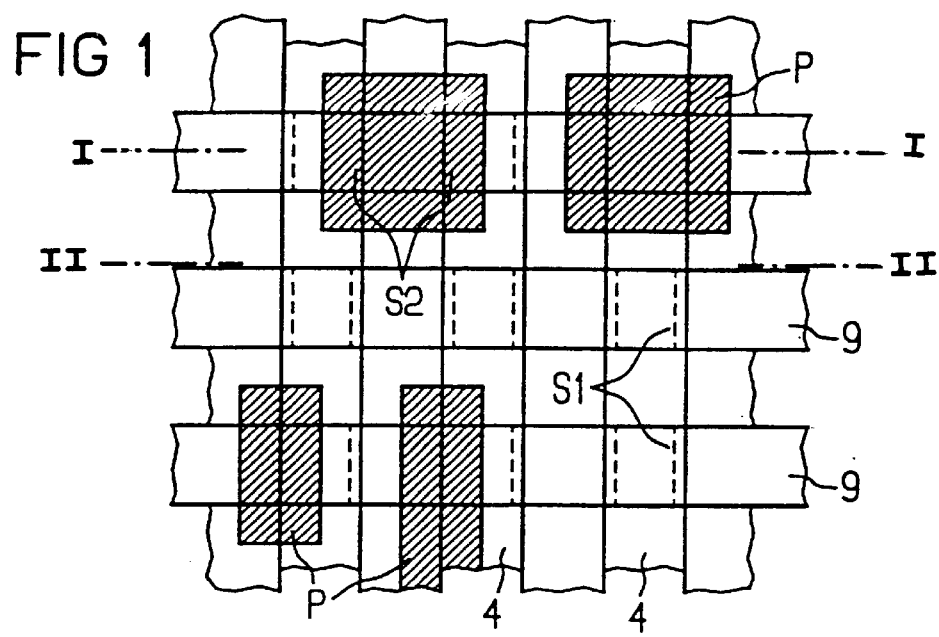
FIG. 1 is a plan view of a cell matrix having a programming mask properly positioned according to the invention.

Referring now to the figures of the drawing in detail and first, particularly, to FIG. 1 thereof, there is shown a plan view of a cell matrix of a memory cell array produced according to the method in accordance with the invention. Word lines 9, trenches 4 and an example of a properly positioned programming mask P are illustrated schematically. The programming mask P only covers hatched, island-shaped areas in which a transistor is not to be produced, that is to say the areas of second memory cells S2. A position of first memory cells S1 is, for reasons of better clarity, marked by a dashed line at a point on a trench wall at which a channel or a gate oxide of an associated transistor is located. At two first memory cells (on the same or on the opposite trench wall) which are adjacent in the direction of the trench, the mask is open in the intermediate area so that a first insulation material 5 can be etched out. The width and spacing of the word lines 9 and of the trenches 4 is preferably F in each case. The "island" (programming mask) for covering the second memory cells S2 can have the extent F in the direction of the word lines, and in the direction of the trench it preferably has a relatively large extent, for example ⅝F, in order to reliably cover the trench wall under the word line 9 in the area of the second memory cells S2, even taking into account alignment inaccuracies, and to exclude the possibility of the first insulation material being etched into.

Figure 2A:
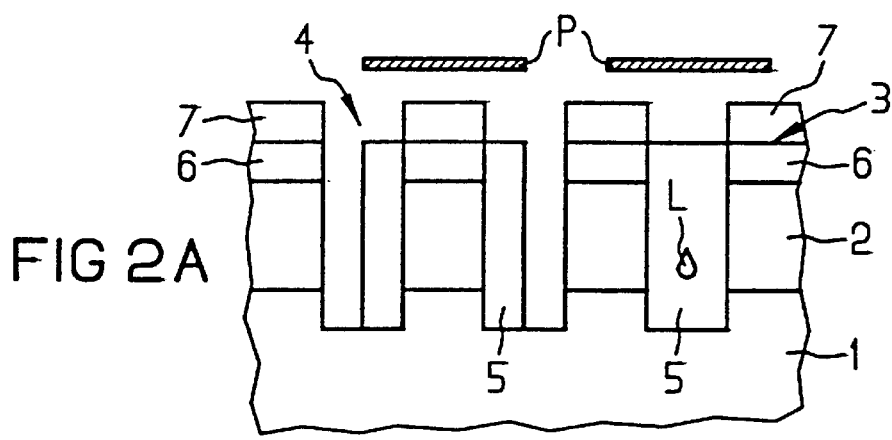
FIGS. 2A and 2B are cross-sectional views through the cell matrix after a programming etching step along the lines I—I and II—II of FIG. 1, respectively.
Figure 2B:
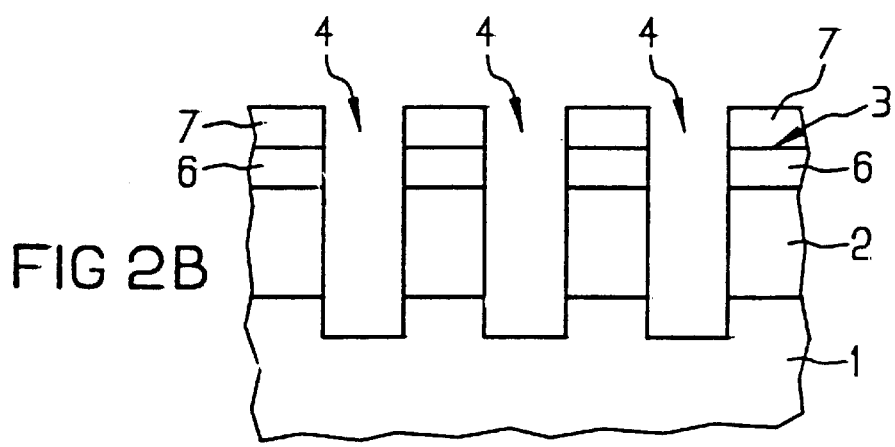

FIGS. 2A and 2B show cross sections through the cell matrix along the lines I—I and II—II after the programming etching (removal of the first insulation material 5 in the areas of not covered by the mask). By way of example, the memory cell array disclosed in German Patent DE 44 37 581 C2 is used as the basis for a read-only memory cell array so that this patent document (in particular the descriptions of the figures) should be referred to for details of the fabrication method.

In summary, the fabrication method provides for an area 2 (p-doped) with a thickness of approximately 0.5 to $1\mu$ to be produced on a semiconductor substrate 1 which is, for example, n-doped. Then, the strip-shaped trenches 4 are produced in the cell matrix with a conventional etching process, and the trenches 4 extend from a surface 3 into the substrate 1, for example to a depth of 0.5 to $1\mu$. The trenches 4 are disposed with a minimum grid spacing of 2F. The trenches 4 are completely filled with the first insulation material 5. To do this, firstly a thin thermal oxide and then a TEOS layer are produced, for example. The first insulation material 5 is completely removed from the surface 3 again. Seconds strip-shaped, doped areas 6 are now produced in the cell matrix on the substrate surface 3 between the trenches 4 (the periphery is covered here with a mask) with the use of an arsenic implantation. The depth of these second doped areas 6, which serve as bit lines, is approximately $0.2\mu$. An insulating layer 7 made of silicon oxide is produced, in a self-aligned way, on the surface of the second doped areas 6 by thermal oxidation.

Then, the programming takes place, i.e. the areas of first and second memory cells S1, S2 are defined with the aid of the programming mask P. The position of the mask P is only schematically indicated in FIGS. 2A and B. The programming mask P covers the areas of the second memory cells S2 reliably, i.e. it has islands at these points. The island for the second memory cells 52 extend in the direction of the word lines 9, preferably to the center of the trench 4 and likewise covers the associated second doped area 6 as far as the center, i.e. it overlaps the trench wall, and its center is preferably aligned with the trench wall. Therefore, islands which are adjacent in the direction of the word lines are in contact with one another. Preferably, this also applies to islands which are adjacent in the direction of the trench. With the aid of the programming mask P, the first insulation material 5 is then etched anisotropically in the trench 4. In FIG. 2A it is clear that the first insulation material 5 remains on the trench wall in the region of the second memory cell S2. The section, which is offset in parallel, in FIG. 2B shows that there is no first insulation material 5 remaining in the trench between memory cells which are adjacent in the direction of the trench and of which at least one is the first memory cell S1. A possible shrinkage cavity (designated by L in FIG. 2A) in the first insulation material 5 is therefore etched open and cut in two.

Figure 3A:
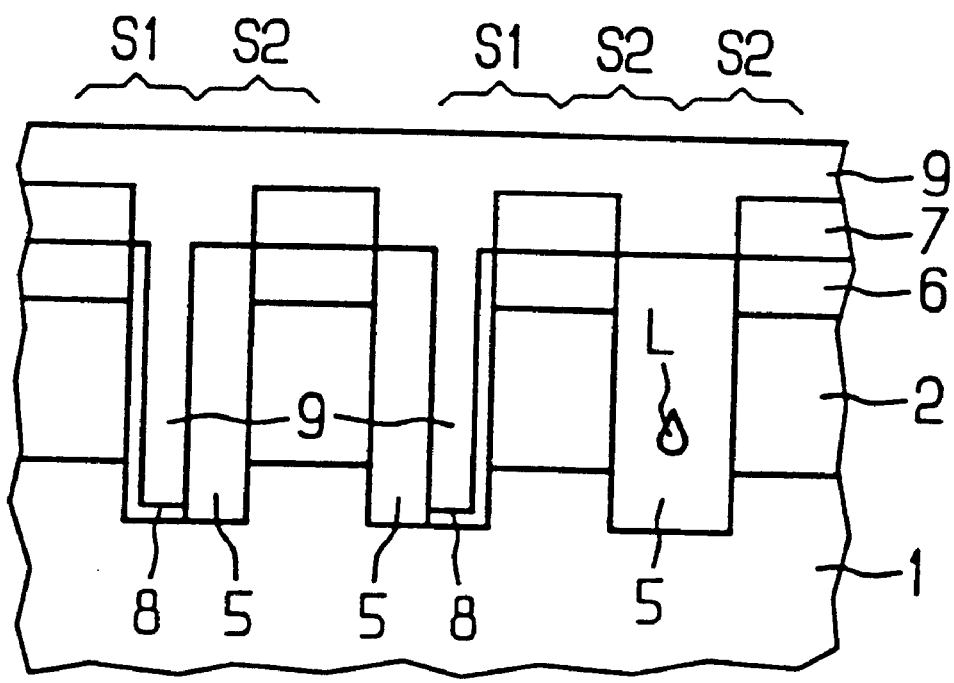
FIGS. 3A and 3B are cross-sectional views through the cell matrix after a second insulation material has been disposed.
Figure 3B:
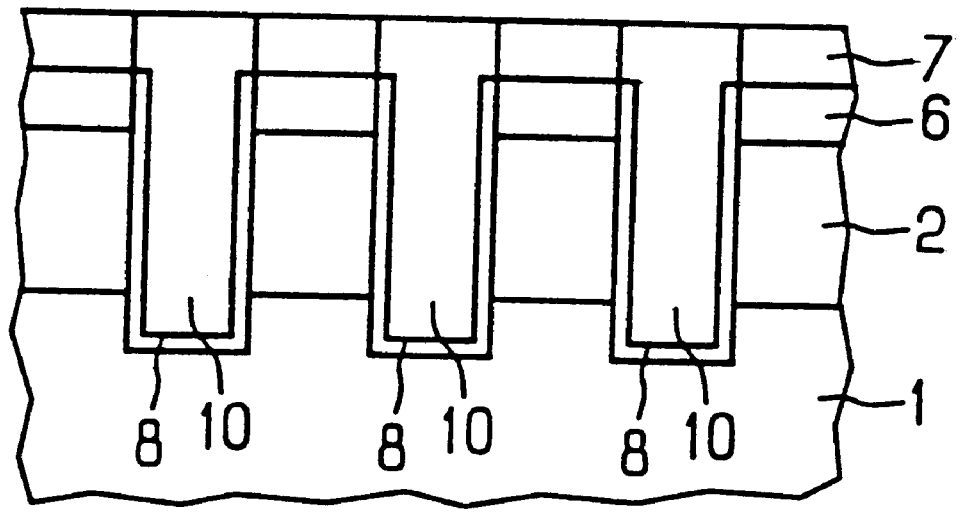

As shown in FIGS. 3A and 3B, after the mask is removed, a thin oxide 8 is produced on the exposed silicon faces, for example by thermal oxidation. It serves as a gate oxide in the region of the first memory cells S1. A material which is suitable for the word line 9, for example 400 nm-doped polysilicon, is deposited over the entire area, so that the trenches 4 are completely filled. With a suitable mask, the polysilicon is structured to form the word lines 9 which run transversely, for example vertically, with respect to the trenches 4. Here it is important that there should be no polysilicon residues remaining in the trenches 4 between the word lines 9 (corresponding to FIG. 3B). On the exposed trench walls in the region of the first memory cell S1, the polysilicon forms the gate electrode of the transistor on the gate oxide 8. The source and drain are formed by the areas 1 and 6. Finally, the remaining trench sections between the word lines 9 which are not filled in are filled in with a second insulation material 10, for example TEOS or BPSG. The second insulation material 10 can then be removed from the surface 3 again, so that it only remains in the trenches 4.

In the periphery, transistors can be produced, as described in the German Patent document DE 44 37 581 C2.

The programming mask P and the method can also be used in other read-only memories. For example in a memory with a bit line which runs on the bottom of the trench and is produced by implantation, such as described in German Patent DE 195 14 834 C1.

We claim:

1. A read-only memory cell array, comprising:
   a semiconductor substrate;
   a cell matrix formed in said semiconductor substrate, said cell matrix having a plurality of strip-shaped trenches running essentially parallel with each other, said trenches having trench walls, said cell matrix including a first type of memory cells each having a MOS transistor disposed vertically with respect to said semiconductor substrate, and a second type of memory cells without any vertical MOS transistors, said first type and said second type of memory cells disposed on predetermined sections of said trench walls;
   a gate dielectric and a gate electrode covering said trench walls in a region of said first type of memory cells, said MOS transistor disposed on said trench walls;
   a first insulation material covering said trench walls in a region of said second type of memory cells;
   a second insulation material and said gate dielectric disposed in said trenches between an adjacent two of said memory cells located along one of said trench walls, at least one of said adjacent two memory cells being of first type of memory cells; and
   word lines running transversely with respect to said trenches and connected to said gate electrode respectively lying under said word lines.

2. The memory cell array according to claim 1, wherein said first insulation material includes TEOS, and said second insulation material includes one of TEOS and BPSG.

3. The memory cell array according to claim 1, wherein said word lines have a width and said width is equal to a spacing between said word lines.

4. In combination with a read-only memory cell array having a cell matrix formed in a semiconductor substrate, the cell matrix including a first memory type of cells having vertical MOS transistors protruding upward from the semiconductor substrate along trenches, and a second type of memory cells without any vertical MOS transistors, a mask for programming the read-only memory cell, the mask comprising: a mask body covering areas of the second type of memory cells in the cell matrix, and leaving open areas between two adjacent memory cells of said first type in a direction of the trenches.

5. In a method for fabricating a read-only memory cell array having a cell matrix disposed in a semiconductor substrate, the cell matrix having a first type of memory cells with MOS transistors and a second type of memory cells without any MOS transistors, the improvement which comprises:
   producing a plurality of strip-shaped trenches running essentially parallel to each other in the semiconductor substrate and forming the trenches with trench walls; forming MOS transistors essentially vertical with respect to the semiconductor substrate at predetermined points on the trench walls;
   filling the trenches with a first insulation material;
   removing the first insulation material in the cell matrix from the trenches at all points with the aid of a programming mask covering areas designated for the second type of memory cells; depositing a gate dielectric and a conductive layer in the exposed trench walls for completing the MOS transistors;
   structuring the conductive layer to form strip-shaped word lines running transversely with respect to the trenches; and
   filling non-filled trench sections remaining between two adjacent memory cells located alone a trench wall with a second insulation material, at least one of the two adjacent memory cells being of the first type of memory cells.

* * * * *